(12) United States Patent
Suematsu et al.

(10) Patent No.: US 11,004,521 B2
(45) Date of Patent: May 11, 2021

(54) SEMICONDUCTOR DEVICE AND SEMICONDUCTOR MEMORY DEVICE

(71) Applicant: KIOXIA CORPORATION, Tokyo (JP)

(72) Inventors: Yasuhiro Suematsu, Yokohama Kanagawa (JP); Masaru Koyanagi, Ota Tokyo (JP); Kensuke Yamamoto, Yokohama Kanagawa (JP); Ryo Fukuda, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/807,890

(22) Filed: Mar. 3, 2020

(65) Prior Publication Data
US 2021/0082525 A1    Mar. 18, 2021

(30) Foreign Application Priority Data

Sep. 13, 2019    (JP) .............................. JP2019-167596

(51) Int. Cl.
| | | |
|---|---|---|
| *G11C 16/10* | (2006.01) | |
| *G11C 16/30* | (2006.01) | |
| *G11C 16/26* | (2006.01) | |

(52) U.S. Cl.
CPC .............. *G11C 16/30* (2013.01); *G11C 16/10* (2013.01); *G11C 16/26* (2013.01)

(58) Field of Classification Search
CPC ......... G11C 16/30; G11C 16/10; G11C 16/26; G11C 5/147; G11C 8/10
USPC ............................................. 365/226, 230.06
See application file for complete search history.

(56) References Cited

U.S. PATENT DOCUMENTS

| | | | |
|---|---|---|---|
| 9,613,943 B2 | 4/2017 | Onda | |
| 2009/0245009 A1* | 10/2009 | Keeth | G11C 29/12005 365/230.03 |
| 2011/0161583 A1* | 6/2011 | Youn | H01L 25/0657 711/115 |
| 2011/0255142 A1* | 10/2011 | Ash | B60J 3/04 359/275 |

(Continued)

FOREIGN PATENT DOCUMENTS

| | | |
|---|---|---|
| JP | 2003-167936 A | 6/2003 |
| JP | 2006-313765 A | 11/2006 |

(Continued)

*Primary Examiner* — Michael T Tran
(74) *Attorney, Agent, or Firm* — Foley & Lardner LLP

(57) ABSTRACT

A semiconductor device includes pads for inputting and outputting data, a plurality of control circuit groups connected to the pads, a first supply line for supplying a first electric potential to the control circuit groups, and a second supply line for supplying a second electric potential lower than the first electric potential to the control circuit groups. At least one of the first electric potential supply line or the second supply line is provided with a blocking region such that the blocking region prevents supply of the first electric potential, and the first electric potential is supplied to the plurality of control circuit groups from the first supply line divided by the blocking region, or the blocking region prevents supply of the second electric potential, and the second electric potential is supplied to the plurality of control circuit groups from the second supply line divided by the blocking region.

16 Claims, 16 Drawing Sheets

(56) References Cited

U.S. PATENT DOCUMENTS

| | | | | |
|---|---|---|---|---|
| 2014/0153148 A1* | 6/2014 | Tang | ............... | H01L 27/0266 |
| | | | | 361/91.5 |
| 2014/0175679 A1* | 6/2014 | Kwon | ............... | H01L 24/06 |
| | | | | 257/784 |
| 2014/0217461 A1* | 8/2014 | Song | ............... | H01L 27/0262 |
| | | | | 257/119 |
| 2014/0258767 A1* | 9/2014 | Park | ............... | G11C 29/028 |
| | | | | 713/503 |
| 2014/0346516 A1* | 11/2014 | Lee | ............... | G11C 5/06 |
| | | | | 257/48 |
| 2014/0355926 A1* | 12/2014 | Velthaus | ............... | G02F 1/0121 |
| | | | | 385/3 |
| 2015/0187402 A1* | 7/2015 | Chun | ............... | G11C 11/4074 |
| | | | | 365/230.02 |
| 2018/0164376 A1* | 6/2018 | Ge | ............... | G01R 31/31721 |
| 2019/0079575 A1* | 3/2019 | Hanson | ............... | G06F 1/3237 |
| 2019/0086474 A1* | 3/2019 | Srinivasan | ............... | G01R 35/00 |
| 2019/0206845 A1 | 7/2019 | Ito et al. | | |
| 2019/0311748 A1* | 10/2019 | Rohleder | ............... | G11C 5/147 |
| 2020/0176339 A1* | 6/2020 | Suyama | ............... | G01R 31/318511 |

FOREIGN PATENT DOCUMENTS

| | | |
|---|---|---|
| JP | 2008-235440 A | 10/2008 |
| WO | WO-2018/055734 A1 | 3/2018 |

\* cited by examiner

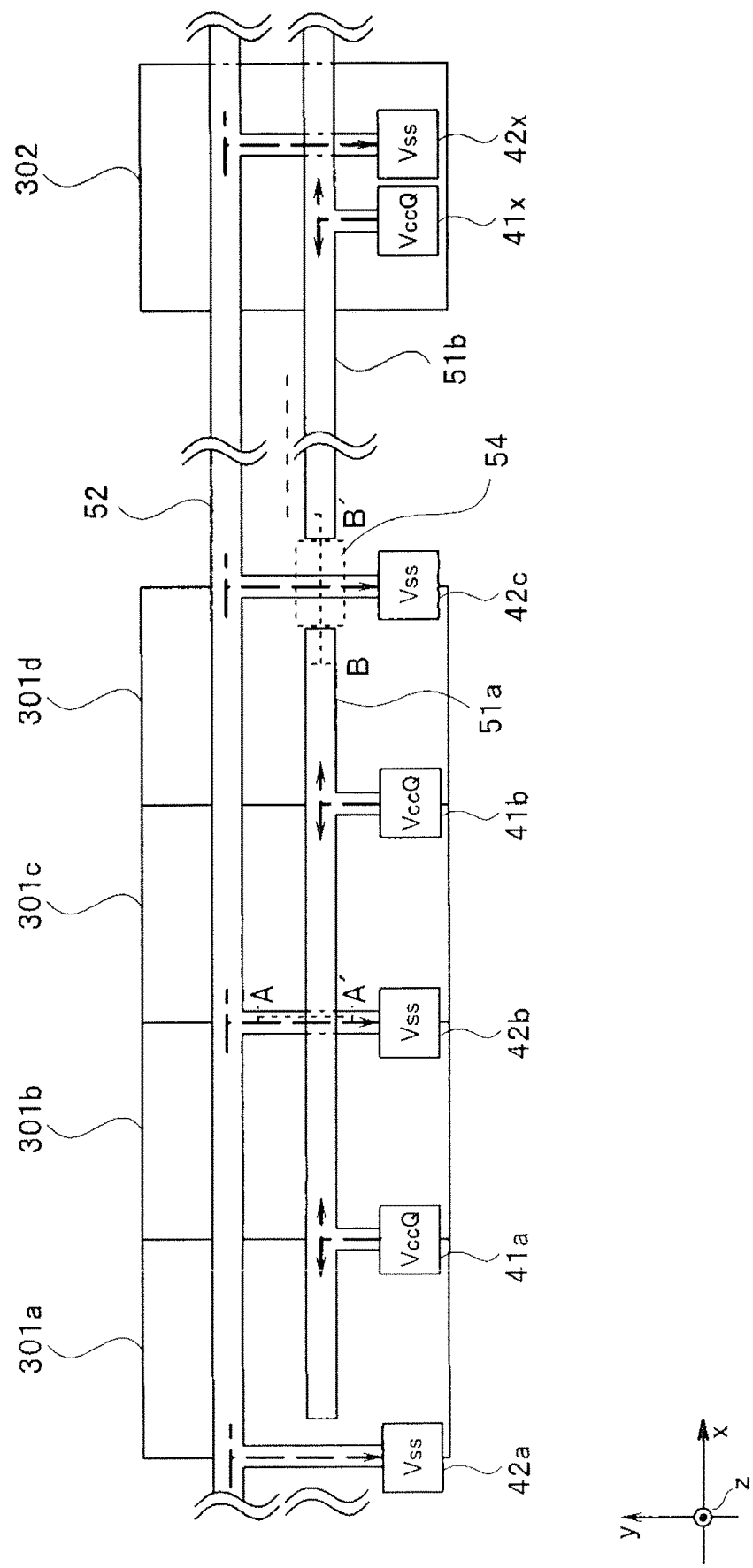#

FIG. 8
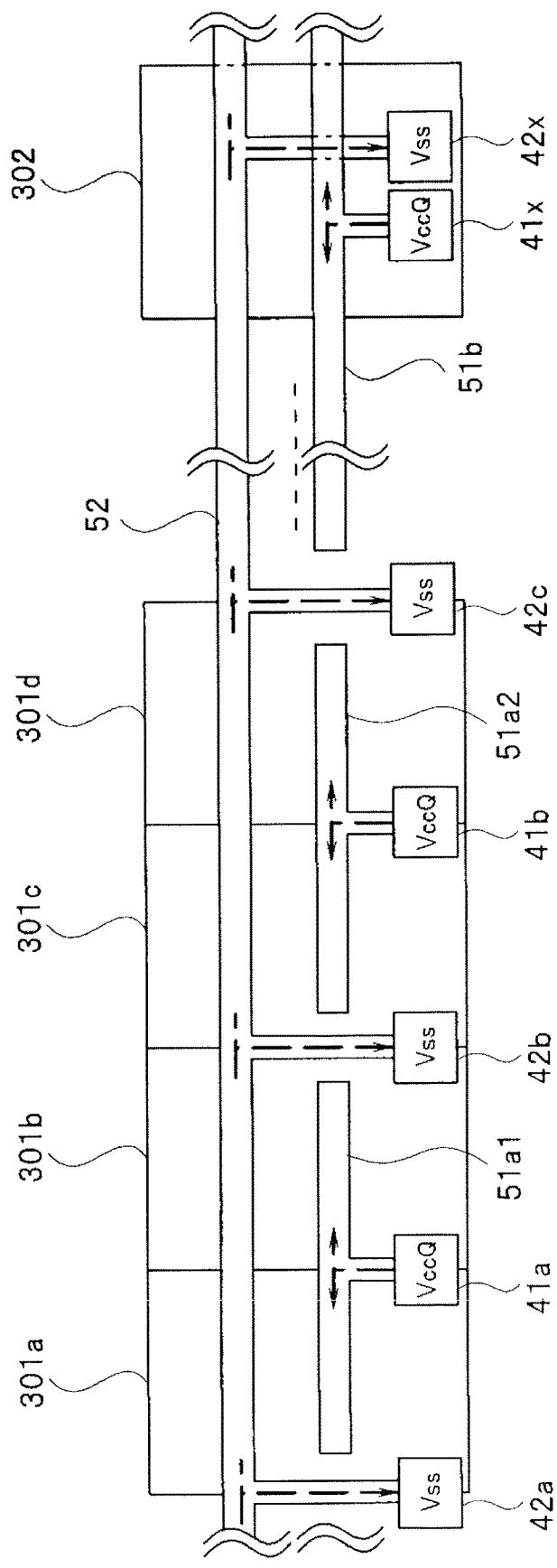
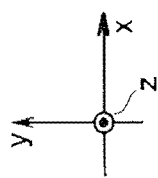

FIG. 9
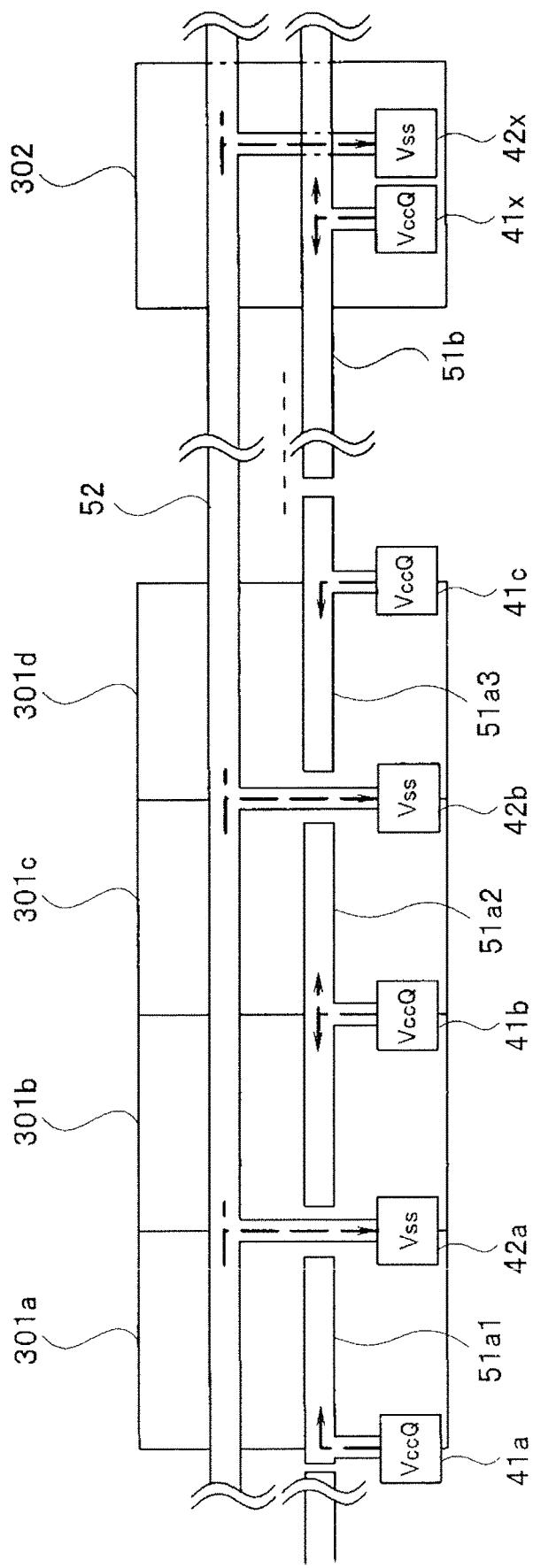
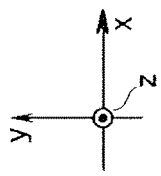

FIG. 10
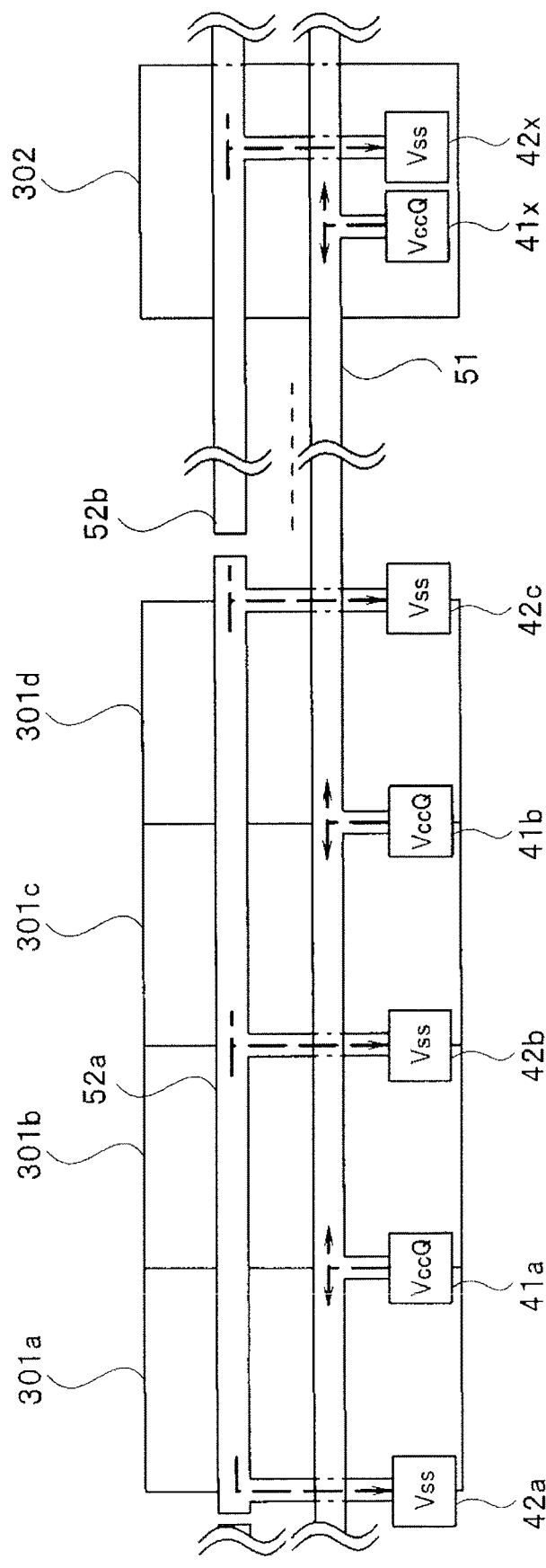
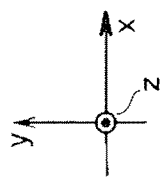

FIG. 11
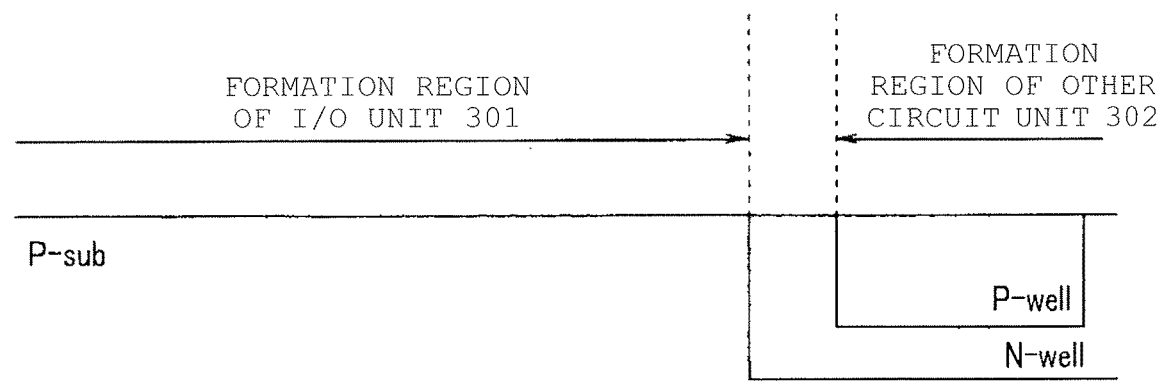
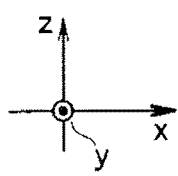

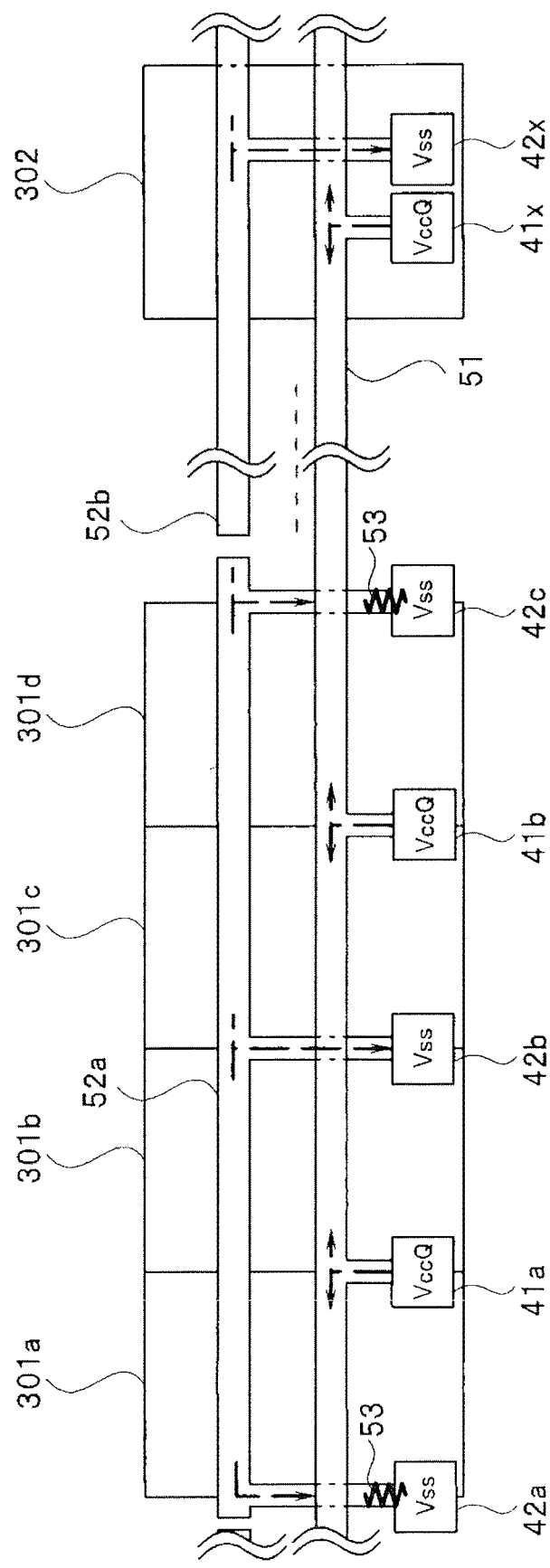
FIG. 12
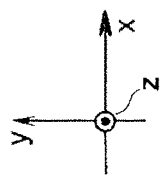

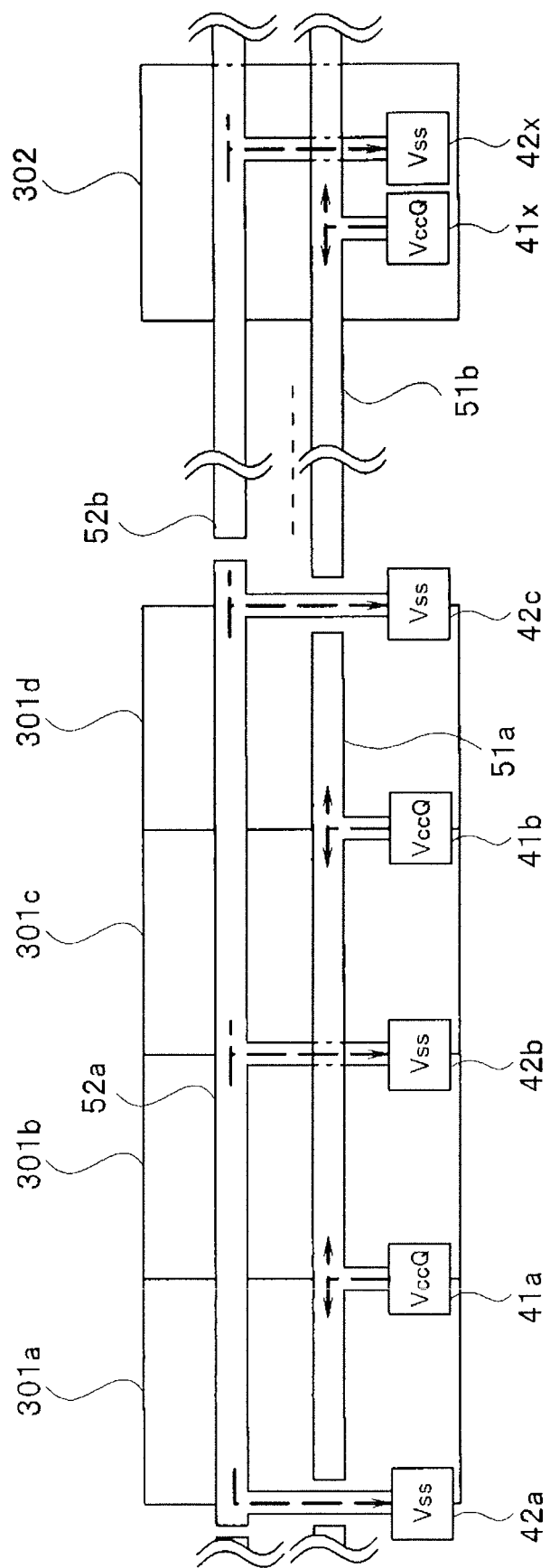
FIG. 13
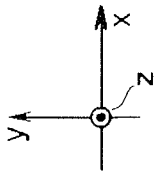

SEMICONDUCTOR DEVICE AND SEMICONDUCTOR MEMORY DEVICE

CROSS-REFERENCE TO RELATED APPLICATION(S)

This application claims the benefit of and priority to Japanese Patent Application No. 2019-167596, filed Sep. 13, 2019, the entire contents of which are incorporated herein by reference.

FIELD

Embodiments described herein relate generally to a semiconductor device and a semiconductor memory device.

BACKGROUND

A semiconductor device is known in which a plurality of IO dedicated power supply terminals are disposed in a data input and output unit (IO unit).

DESCRIPTION OF THE DRAWINGS

FIG. 5 is a schematic layout diagram of power supply pads and power supply wirings of a pad unit according to a first embodiment;

FIG. 8 is a schematic layout diagram of power supply pads and power supply wirings in a pad unit according to a modification of the first embodiment;

FIG. 9 is another schematic layout diagram of power supply pads and power supply wirings of the pad unit according to the modification of the first embodiment;

FIG. 10 is a schematic layout diagram of power supply pads and power supply wirings of a pad unit according to a second embodiment;

FIG. 11 is a cross-sectional view schematically showing a substrate structure in formation regions of an I/O unit and other circuit units;

FIG. 12 is a schematic layout diagram of power supply pads and power supply wirings of a pad unit according to a modification of the second embodiment;

FIG. 13 is a schematic layout diagram of power supply pads and power supply wirings of a pad unit according to a third embodiment;

DETAILED DESCRIPTION

Embodiments provide a semiconductor device and a semiconductor memory device that can improve alternating current (AC) characteristics of an IC circuit.

In general, according to one embodiment, a semiconductor device may include a plurality of pads for inputting and outputting data, a plurality of input and output control circuit groups connected to each of the pads, a first electric potential supply line for supplying a first electric potential to each of the input and output control circuit groups, a second electric potential supply line for supplying a second electric potential lower than the first electric potential to each of the input and output control circuit groups, a plurality of first power supply pads for supplying the first electric potential to the first electric potential supply line, and a plurality of second power supply pads for supplying the second electric potential to the second electric potential supply line. At least one of the first electric potential supply line or the second electric potential supply line may be provided with a first supply prevention unit that blocks the supply of the first electric potential or the second electric potential, and the first electric potential or the second electric potential may be supplied to the plurality of input and output control circuit groups from the input and output electric potential supply line that is one of the first electric potential supply line and the second electric potential supply line divided by the first supply prevention unit.

Hereinafter, embodiments will be described with reference to the drawings.

(First Embodiment)
(1. Configuration)
(1-1. Configuration of Memory System)

Figure 1:
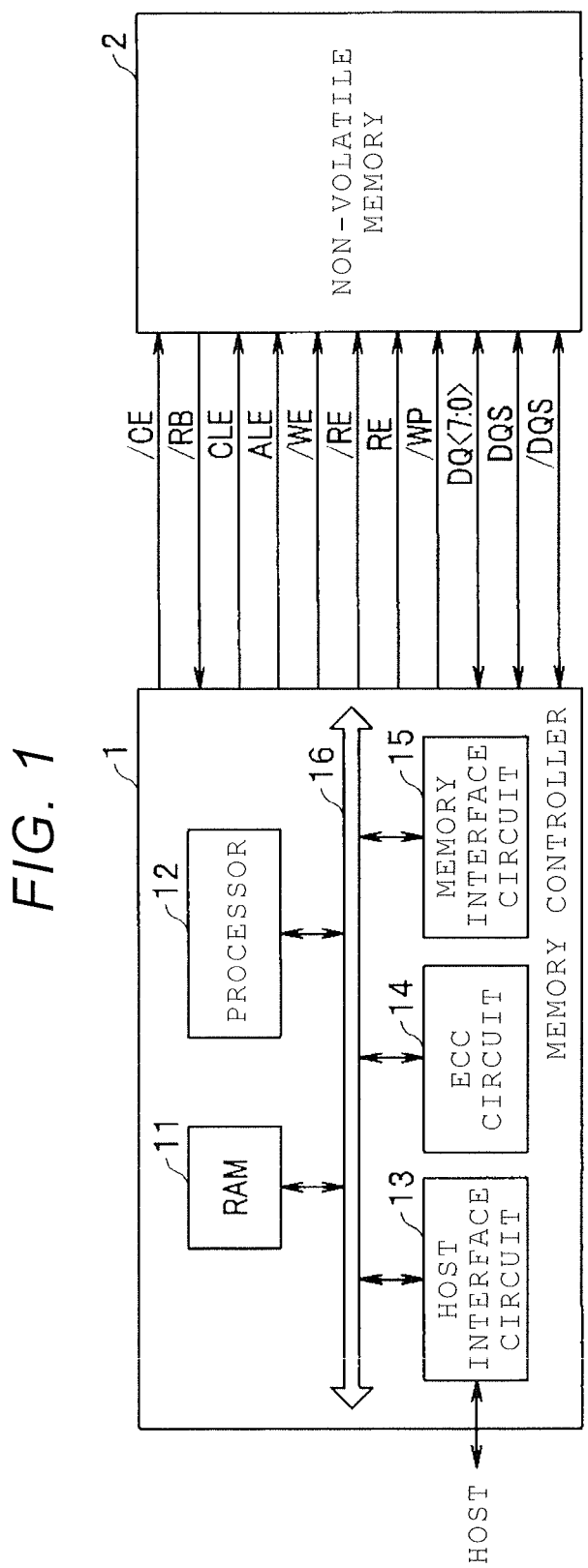
FIG. 1 is a block diagram showing a configuration example of a memory device according to an embodiment of the present disclosure.

FIG. 1 is a block diagram showing a configuration example of a memory system according to an embodiment of the present disclosure. The memory system of the present embodiment includes a memory controller 1 and a non-volatile memory 2 as a semiconductor memory device. The memory system can be connected to a host. The host is, for example, an electronic device such as a personal computer or a mobile terminal.

The non-volatile memory 2 may be a memory that stores data in a non-volatile manner, and may include, for example, a NAND memory (NAND flash memory). The non-volatile memory 2 may be, for example, a NAND memory including memory cells capable of storing 3 bits per memory cell, that is, a bit/cell (TLC: Triple Level Cell) NAND memory. The non-volatile memory 2 may be a 1-bit/cell, 2-bit/cell, or 4-bit/cell NAND memory.

The memory controller 1 may control writing of data to the non-volatile memory 2 according to a write request from the host. The memory controller 1 may control reading of data from the non-volatile memory 2 according to a read request from the host. At least one of a chip enable signal/CE, a ready/busy signal/RB, a command latch enable signal CLE, an address latch enable signal ALE, a write enable signal/WE, read enable signals RE and /RE, a write protect signal/WP, a signal DQ<7:0> which are data, or data strobe signals DQS and/DQS may be transmitted and received between the memory controller 1 and the non-volatile memory 2.

For example, each of the non-volatile memory 2 and the memory controller 1 may be formed as a semiconductor chip (hereinafter also simply referred to as "chip").

The chip enable signal/CE may be a signal for enabling the non-volatile memory 2. The ready/busy signal/RB may be a signal for indicating whether the non-volatile memory 2 is in a ready state (a state in which an external command is received) or in a busy state (a state in which an external command is not received). The command latch enable signal CLE may be a signal indicating that the signal DQ<7:0> is a command. The address latch enable signal ALE may be a signal indicating that the signal DQ<7:0> is an address. The write enable signal/WE may be a signal for taking the received signal into the non-volatile memory 2 and may be asserted every time the command, address, and data are received by the memory controller 1. The non-volatile memory 2 may be instructed to capture the signal DQ<7:0> while the signal/WE is at the "L (Low)" level.

The read enable signals RE and/RE may be signals for the memory controller 1 to read data from the non-volatile memory 2. For example, the read enable signals RE and/RE are used for controlling the operation timing of the non-volatile memory 2 when outputting the signal DQ<7:0>. The write protect signal/WP may be a signal for instructing the non-volatile memory 2 to prohibit writing and erasing of data. The signal DQ<7:0> may be data transmitted or received between the non-volatile memory 2 and the memory controller 1 and includes a command, an address, and data. The data strobe signals DQS and/DQS may be signals for controlling the input and output timing of the signal DQ<7:0>.

The memory controller 1 includes a Random Access Memory (RAM) 11, a processor 12, a host interface circuit 13, an Error Check and Correct (ECC) circuit 14, and a memory interface circuit 15. The RAM 11, the processor 12, the host interface circuit 13, the ECC circuit 14, and the memory interface circuit 15 are connected to each other via an internal bus 16.

The host interface circuit 13 may output a request, user data (write data), and the like received from the host to the internal bus 16. In addition, the host interface circuit 13 may transmit user data read from the non-volatile memory 2, a response from the processor 12, and the like to the host.

The memory interface circuit 15 may control the process of writing user data and the like to the non-volatile memory 2 and the process of reading from the non-volatile memory 2 based on instructions from the processor 12.

The processor 12 may control the memory controller 1 in an integrated manner. The processor 12 may be, for example, a Central Processing Unit (CPU), a Micro Processing Unit (MPU), or the like. When receiving a request from the host via the host interface circuit 13, the processor 12 may perform control according to the request. For example, the processor 12 instructs the memory interface circuit 15 to write user data and parity to the non-volatile memory 2 according to a request from the host. Further, the processor 12 may instruct the memory interface circuit 15 to read user data and parity from the non-volatile memory 2 according to a request from the host.

The processor 12 may determine a storage area (memory area) on the non-volatile memory 2 for user data stored in the RAM 11. User data may be stored in the RAM 11 via the internal bus 16. The processor 12 may determine the memory area for page unit data (page data) which is a write unit. In the present specification, user data stored in one page of the non-volatile memory 2 is defined as unit data. The unit data may be generally encoded by the ECC circuit 14 and stored in the non-volatile memory 2 as a code word. In the embodiment, encoding is not essential. The memory controller 1 may store the unit data in the non-volatile memory 2 without encoding, but FIG. 1 shows a configuration for encoding as one configuration example. When the memory controller 1 does not perform encoding, the page data may match the unit data. Further, one code word may be generated based on one unit data, or one code word may be generated based on divided data obtained by dividing unit data. One code word may be generated using a plurality of unit data.

The processor 12 may determine the memory area of the non-volatile memory 2 to be written for each unit data. A physical address may be assigned to the memory area of the non-volatile memory 2. The processor 12 may manage the memory area to which unit data is written using the physical address. The processor 12 may designate the determined memory area (physical address) and instruct the memory interface circuit 15 to write user data to the non-volatile memory 2. The processor 12 may manage the correspondence between the logical address of the user data (logical address managed by the host) and the physical address. When receiving a read request including a logical address from the host, the processor 12 may specify a physical address corresponding to the logical address, and instruct the memory interface circuit 15 to read user data by designating the physical address.

The ECC circuit 14 may encode user data stored in the RAM 11 to generate a code word. Further, the ECC circuit 14 may decode the code word read from the non-volatile memory 2.

The RAM 11 may temporarily store user data received from the host until the user data is stored in the non-volatile memory 2, or temporarily store data read from the non-volatile memory 2 until the data to is transmitted to the host. The RAM 11 may be a general-purpose memory such as a Static Random Access Memory (SRAM) or a Dynamic Random Access Memory (DRAM).

FIG. 1 shows a configuration example in which the memory controller 1 includes each of the ECC circuit 14 and the memory interface circuit 15. However, the ECC circuit 14 may be built in the memory interface circuit 15. Further, the ECC circuit 14 may be built in the non-volatile memory 2.

When a write request is received from the host, the memory system operates as follows. The processor 12 may temporarily store data to be written in the RAM 11. The processor 12 may read the data stored in the RAM 11 and input the read data to the ECC circuit 14. The ECC circuit 14 may encode the input data and input a code word to the memory interface circuit 15. The memory interface circuit 15 may write the input code word to the non-volatile memory 2.

When a read request is received from the host, the memory system operates as follows. The memory interface circuit 15 may input the code word read from the non-volatile memory 2 to the ECC circuit 14. The FCC circuit 14 may decode the input code word and store the decoded data in the RAM 11. The processor 12 may transmit the data stored in the RAM 11 to the host via the host interface circuit 13.

(1-2. Configuration of Non-Volatile Memory)

Figure 2:
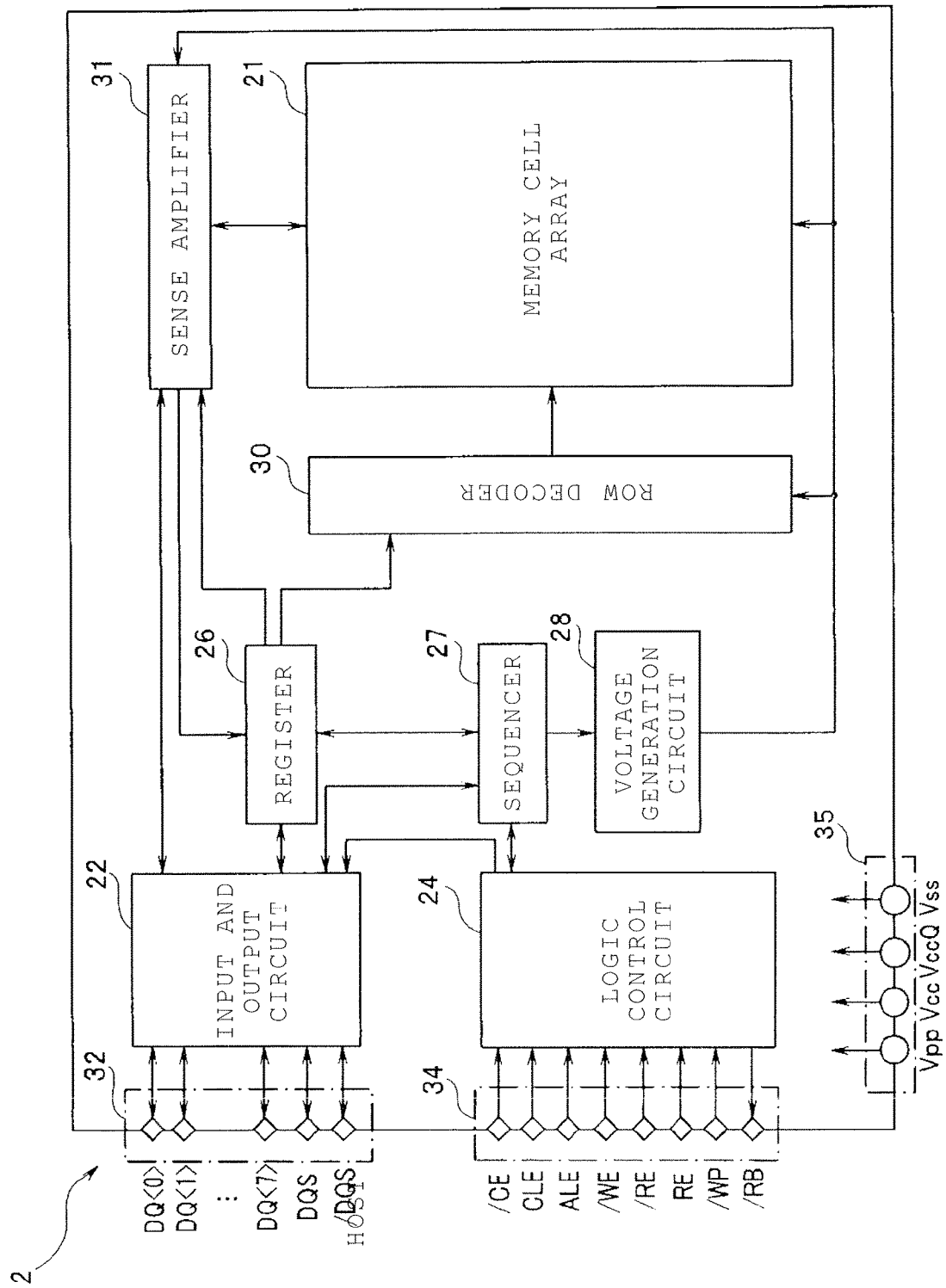
FIG. 2 is a block diagram showing a configuration example of a non-volatile memory according to the embodiment of the present disclosure.

FIG. 2 is a block diagram showing a configuration example of a non-volatile memory according to the present embodiment. The non-volatile memory 2 includes a memory cell array 21, an input and output circuit 22, a logic control circuit 24, a register 26, a sequencer 27, a voltage generation circuit 28, a row decoder 30, a sense amplifier 31, an input and output pad group 32, a logic control pad group 34, and a power supply input terminal group 35.

The memory cell array 21 may include a plurality of non-volatile memory cells (not shown) associated with word lines and bit lines.

The input and output circuit 22 may transmit and receive the signal DQ<7:0> and the data strobe signals DQS and/DQS to and from the memory controller 1. The input and output circuit 22 may transfer the command and address in the signal DQ<7:0> to the register 26. Also, the input and output circuit 22 may transmit and receive write data and read data to and from the sense amplifier 31.

The logic control circuit 24 may receive the chip enable signal/CE, the command latch enable signal CLE, the address latch enable signal ALE, the write enable signal/WE, the read enable signals RE and/RE, and the write protect signal/WP from the memory controller 1. In addition, the logic control circuit 24 may transfer the ready/busy signal/RB to the memory controller 1 to notify the state of the non-volatile memory 2 to the outside.

The voltage generation circuit 28 may generate a voltage necessary for operations such as writing, reading, and erasing of data based on an instruction from the sequencer 27.

The row decoder 30 may receive a block address and a row address in the address from the register 26, select a corresponding block based on the block address, and select a corresponding word line based on the row address.

When reading data, the sense amplifier 31 may sense read data read from the memory cell to the bit line, and transfer the sensed read data to the input and output circuit 22. When writing data, the sense amplifier 31 may transfer write data written through the bit line to the memory cell.

Since the input and output pad group 32 transmits and receives each signal including data to and from the memory controller 1, the input and output pad group 32 may include a plurality of terminals (pads) corresponding to the signal DQ<7:0> and the data strobe signals DQS and/DQS.

The logic control pad group 34 may transmit and receive each signal to and from the memory controller 1, and thus include a plurality of terminals (pads) corresponding to the chip enable signal/CE, the command latch enable signal CLE, the address latch enable signal ALE, the write enable signal/WE, and the read enable signals RE and/RE, and write protect signal/WP.

The power supply input terminal group 35 may include a plurality of terminals for inputting power supply voltages Vcc, VccQ, and Vpp and a ground voltage Vss in order to supply various operating powers to the non-volatile memory 2 from the outside. The power supply voltage Vcc may be a circuit power supply voltage generally given from the outside as an operation power supply, and for example, a voltage of about 3.3 V is input. For example, a voltage of 1.2 V is input as the power supply voltage VccQ. The power supply voltage VccQ may be used when signals are transmitted and received between the memory controller 1 and the non-volatile memory 2. As the operation speed is increased, in a terminal for inputting the power supply voltage VccQ as a first electric potential and the ground voltage Vss as a second electric potential, a plurality of power supply pads dedicated to the input and output terminals may be disposed in the vicinity of the input and output pad group 32. The specific layout of these power supply pads will be described in detail later.

The power supply voltage Vpp may be a power supply voltage higher than the power supply voltage Vcc, and for example, a voltage of 12V is input. When writing data to the memory cell array 21 or erasing data, a high voltage of about 20V may be required. At this time, it is possible to generate a desired voltage at high speed and with low power consumption by boosting the power supply voltage Vpp of about 12V rather than boosting the power supply voltage Vcc of about 3.3V with a boosting circuit of the voltage generation circuit 28. On the other hand, for example, when the non-volatile memory 2 is used in an environment where a high voltage cannot be supplied, the power supply voltage Vpp may not be supplied with a voltage. Even when the power supply voltage Vpp is not supplied, the non-volatile memory 2 can perform various operations as long as the power supply voltage Vcc is supplied. That is, the power supply voltage Vcc may be a power supply that is normally supplied to the non-volatile memory 2, and the power supply voltage Vpp may be a power supply that is additionally and optionally supplied depending on the use environment, for example.

(2. Layout)

(2-1. Pad Layout in Chip)

Figure 3:
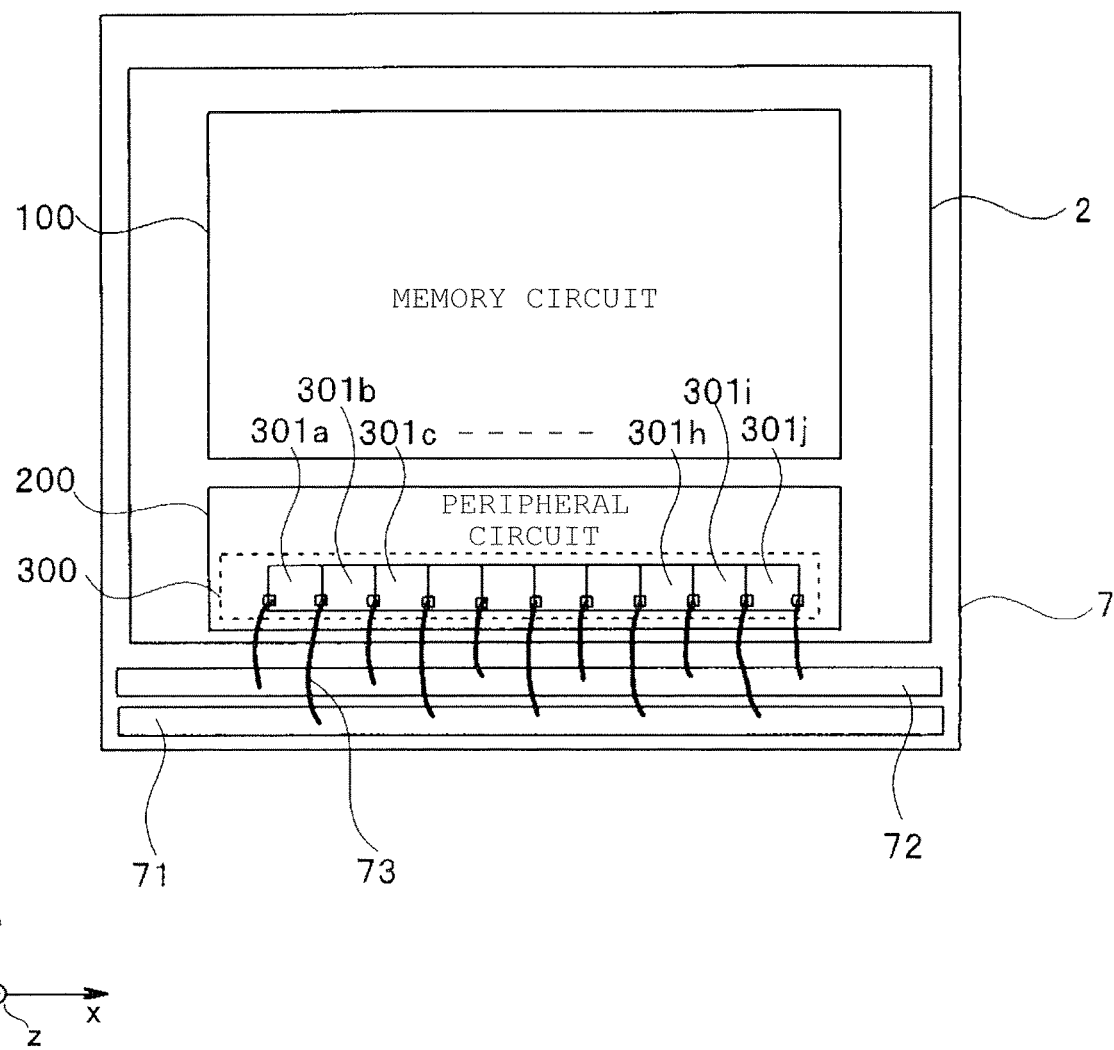
FIG. 3 is a schematic layout diagram of a non-volatile memory on a chip.

FIG. 3 is a schematic layout diagram of a non-volatile memory on a chip. That is, FIG. 3 is a schematic layout diagram in the XY plane of the non-volatile memory as viewed from the Z direction. FIG. 3 shows a state in which the non-volatile memory 2 is mounted on a wiring substrate 7. The wiring substrate 7 is, for example, an insulating resin wiring substrate or a ceramic wiring substrate having a wiring layer provided on the surface or inside thereof. Specifically, for example, a printed wiring substrate using glass-epoxy resin is used. Alternatively, a silicon interposer or a lead frame may be used. As an example of a wiring layer provided on the wiring substrate 7, FIG. 3 shows a VccQ wiring 71 and a Vss wiring 72. The VccQ wiring 71 and the Vss wiring 72 may be connected to a lead frame or the like, and a predetermined voltage may be supplied from the outside via the lead frame or the like.

As shown in FIG. 3, the non-volatile memory 2 according to the present embodiment is roughly divided into two regions (e.g., a memory circuit 100 and a peripheral circuit 200) in the Y direction on a chip having a substantially rectangular shape. The peripheral circuit 200 may be provided with a pad unit 300. The two regions (e.g., the memory circuit 100 and the peripheral circuit 200) may be provided over almost the entire region in the X direction at the respective positions in the Y direction. In the following description, regarding the region occupied by each component of the non-volatile memory 2 on the chip, the length in the X-direction of the region may be indicated as "width", and the length in the Y direction may be indicated as "height". Further, the length in the Z direction of the region is referred to as "depth".

In the memory circuit 100 disposed on the upper side in the height direction of the chip (one end side in the Y direction), the memory cell array 21, the row decoder 30, and the sense amplifier 31 are mainly provided.

In the peripheral circuit 200 disposed on the lower side in the height direction of the chip (the other end side in the Y direction), the input and output circuit 22 (however, excluding the components in an I/O unit 301), the register 26, the sequencer 27, the voltage generation circuit 28, the logic control circuit 24, and the like are provided in addition to the pad unit 300.

In the pad unit 300 disposed at the end portion on the lower side in the height direction of the chip (the other end side in the Y direction), a plurality of I/O units 301 may be formed in a one-dimensional array at predetermined intervals along the chip end. In each I/O unit 301, one pad in the input and output pad group 32 and the logic control pad group 34 is provided. FIG. 3 shows only the I/O units 301a to 301j, among the plurality of I/O units 301, for the input and output pad group 21, and the illustration of the I/O unit for the logic control pad group 34 is omitted.

For example, a pad for inputting and outputting the signal DQ<0> may be provided in the I/O unit 301a, and a pad for inputting and outputting the signal DQ<3> may be provided in the I/O unit 301d. Further, a pad for inputting the data strobe signal DQS may be provided in the I/O unit 301e, and a pad for inputting the data strobe signal/DQS may be provided in the I/O unit 301f. Further, a pad for inputting and outputting the signal DQ<4> may be provided in the I/O unit 301g, and a pad for inputting and outputting the signal DQ<7> may be provided in the I/O unit 301j.

In other words, pads for inputting the signals DQ<7:0> may be provided in the four I/O units from the left end in the x-direction and the four I/O units from the right end in the x-direction, and pads for inputting the data strobe signals DQS and/DQS may be provided in the two I/O units in the center in the x-direction.

A power supply pad dedicated to I/O (a VccQ power supply pad and a Vss power supply pad) may be provided in each I/O unit 301. The VccQ power supply pad provided in the I/O unit 301 and the VccQ wiring 71 provided on the wiring substrate 7 may be electrically connected by a bonding wire 73. Further, the Vss power supply pad provided in the I/O unit 301 and the Vss wiring 72 provided in the wiring substrate 7 may be electrically connected by the bonding wire 73.

(2-2. Layout of Power Supply Pad and Power Supply Wiring in I/O Unit)

Figure 4:
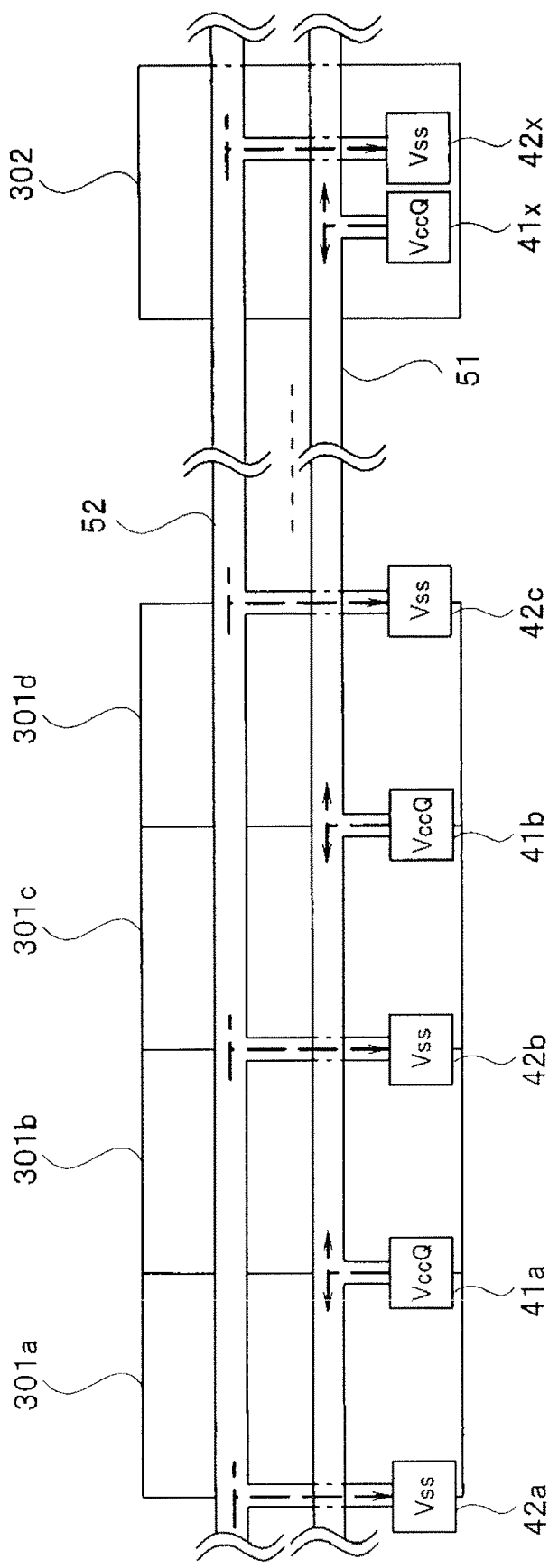
FIG. 4 is a schematic layout diagram of power supply pads and power supply wirings in a pad unit according to a comparative example.

In describing the layout of the power supply pad and power supply wiring in the pad unit 300 of the present embodiment, first, the layout of the pad unit 300 of a comparative example is described with reference to FIG. 4. FIG. 4 is a schematic layout diagram of power supply pads and power supply wirings of a pad unit according to the comparative example. FIG. 4 shows the four I/O units 301a to 301d from the left in the x-direction, and the other I/O units 301e to 301j are not shown.

A plurality of I/O dedicated power supply pads 41 (e.g., 41a, 41b in FIG. 4) and a plurality of I/O dedicated power supply pads 42 (e.g., 42a, 42b, 42c in FIG. 4) may be provided in the plurality of I/O units 301 (e.g., 301a, 301b, 301c, 301d in FIG. 4), generally. For example, a pair of a VccQ power supply pad 41 as a first power supply pad and a Vss power supply pad 42 as a second power supply pad are provided for each of two adjacent I/O units 301. One power supply pad 41 or 42 may supply a power supply voltage to one or more adjacent I/O units 301.

For example, a Vss power supply pad 42a is disposed near the left end of the I/O unit 301a, and a VccQ power supply pad 41a is disposed near the right end of the I/O unit 301a (near the boundary with the adjacent I/O unit 301b). A Vss power supply pad 42b is disposed near the right end of the I/O unit 301b (near the boundary with the adjacent I/O unit 301c). Further, a VccQ power supply pad 41b is disposed near the right end of the I/O unit 301c (near the boundary with the adjacent I/O unit 301d). Further, a Vss power supply pad 42c is disposed near the right end of the I/O unit 301d. In the peripheral circuit 200, a circuit unit 302 other than the pad unit 300 (hereinafter referred to as the other circuit unit 302) is also provided. In addition, a VccQ power supply pad 41x and a Vss power supply pad 42x supply a voltage to a circuit provided in the other circuit unit 302.

The peripheral circuit 200 is provided with two power supply voltage lines, that is, a VccQ voltage supply line 51 and a Vss voltage supply line 52. The VccQ power supply pads 41a, 41b, . . . , 41x in the peripheral circuit 200 are connected to the VccQ voltage supply line 51 as a first electric potential supply line. Further, the Vss power supply pads 42a, 42b, 42c, . . . , 42x in the peripheral circuit 200 are connected to the Vss voltage supply line 52 as a second electric potential supply line.

A circuit provided in each I/O unit 301 is connected to the VccQ voltage supply line 51 and the Vss voltage supply line 52. The power supply voltage VccQ supplied from the nearest VccQ power supply pad 41 may be input to a circuit provided in each I/O unit 301 via the VccQ voltage supply line 51. Further, the ground voltage Vss supplied from the nearest Vss power supply pad 42 may be input via the Vss voltage supply line 52.

For example, the I/O unit 301a may be supplied with the power supply voltage VccQ from the VccQ power supply pad 41a and supplied with the ground voltage Vss from the Vss power supply pad 42a. Further, the I/O unit 301b is supplied with the power supply voltage VccQ from the VccQ power supply pad 41a and supplied with the ground voltage Vss from the Vss power supply pad 42b. Further, the I/O unit 301c may be supplied with the power supply voltage VccQ from the VccQ power supply pad 41b and supplied with the ground voltage Vss from the Vss power supply pad 42b. The I/O unit 301d may be supplied with the power supply voltage VccQ from the VccQ power supply pad 41b and supplied with the ground voltage Vss power from the Vss power supply pad 42c.

In the configuration shown in FIG. 4, two VccQ power supply pads 41 (e.g., 41a, 41b) and three Vss power supply pads 42 (e.g., 42a, 42b, 42c) are provided for four I/O units 301a to 301d. The Vss power supply pad 42a may supply the ground power supply Vss to one I/O unit 301a. Similarly, the Vss power supply pad 42c may supply the ground power supply Vss to one I/O unit 301d. In contrast, the Vss power supply pad 42b may supply the ground power supply Vss to the two I/O units 301b and 301c. That is, the current that flows from the circuit of the two I/O units 301b and 301c into the Vss power supply pad 42b may be about twice the current that flows from the circuit of the I/O unit 301a into the Vss power supply pad 42a. Similarly, the current that flows from the circuit of the two I/O units 301b and 301c into the Vss power supply pad 42b may be about twice the current that flows from the circuit of the I/O unit 301d into the Vss power supply pad 42c. In FIG. 4, the currents input to and output from the VccQ power supply pad 41 and the Vss power supply pad 42 are indicated by thick broken lines. The arrow at the tip of the thick broken line indicates the direction of current flow.

Accordingly, skew (e.g., timing deviation) due to the power supply voltage difference between the I/O units may occur, and there is a possibility that output signals from the pads in the I/O units 301b and 301c are delayed than the output signal from the pads in the I/O units 301a and 301d. In addition, current can flow into and out of the I/O units 301a and 301d located at the end portions through the VccQ voltage supply line 51 and the Vss voltage supply line 52 between the I/O units 301a and 301d and the adjacent other circuit unit 302 and the like. This inflow or outflow current may become a disturbance factor of the power supply voltage of the I/O units 301a and 301d, and the difference in the power supply voltage from that of the I/O units 301b and 301c may increase to increase the skew.

Next, the layout of the pad unit 300 in the present embodiment will be described with reference to FIG. 5. FIG. 5 is a schematic layout diagram of power supply pads and power supply wirings of a pad unit according to the first embodiment. As shown in FIG. 5, the layout of the I/O dedicated power supply pads 41 and 42 provided in the pad I/O unit 301 is the same as the layout of the comparative example shown in FIG. 4. That is, two VccQ power supply pads 41 and three Vss power supply pads 42 are provided for the four I/O units 301a to 301d. Further, the circuits provided in the respective I/O units 301 are connected to the VccQ voltage supply line 51 and the Vss voltage supply line 52. The power supply voltage VccQ supplied from the nearest VccQ power supply pad 41 may be input to the circuit provided in each I/O unit 301 via the VccQ voltage supply line 51. Further, the ground voltage Vss supplied from the nearest Vss power supply pad 42 may be input via the Vss voltage supply line 52.

This embodiment as shown in FIG. 5 differs from the comparative example shown in FIG. 4 in the layout of the VccQ voltage supply line 51. That is, the VccQ voltage supply line 51 is divided into a VccQ voltage supply line 51a as an input electric potential supply line laid inside the I/O units 301a to 301d and a VccQ voltage supply line 51b laid outside the I/O units 301a to 301d. As a result, by forming the VccQ voltage supply line 51 in a divided manner, it is possible to prevent current from flowing into and out of the adjacent other circuit unit 302 and the like via the VccQ voltage supply line 51. That is, since the disturbance factor of the power supply voltage of the I/O units 301a and 301d can be eliminated, the skew between the I/O units 301a to 301d can be reduced. Accordingly, the AC characteristics of the I/O unit 301 can be improved.

Figure 6A:
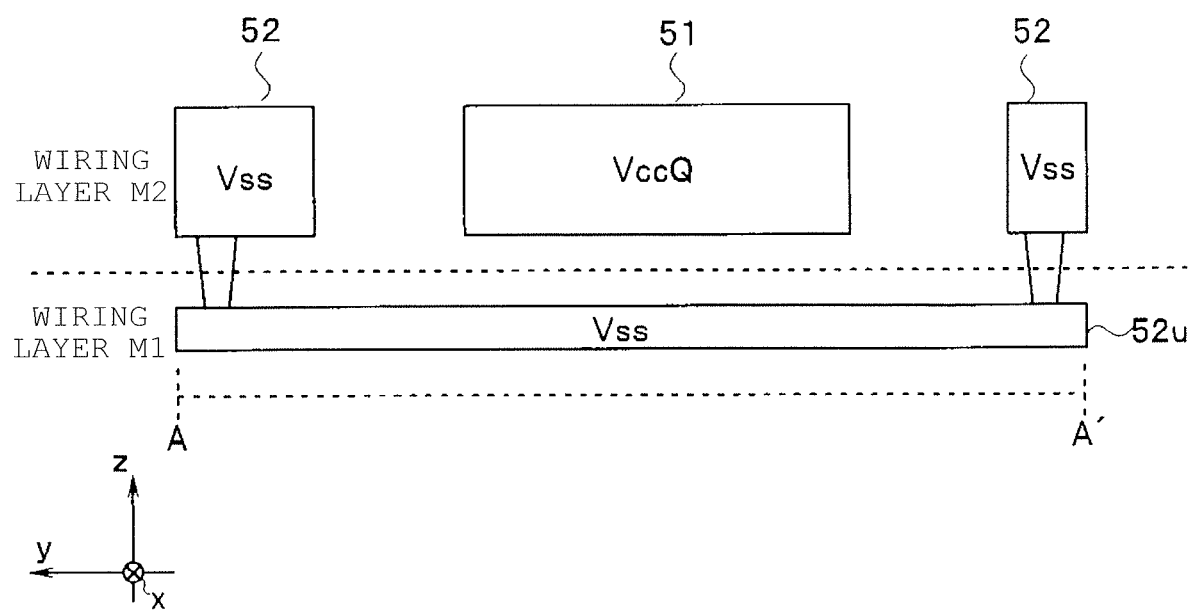
FIG. 6A is a cross-sectional view taken along line A-A' of FIG. 5.
Figure 6B:
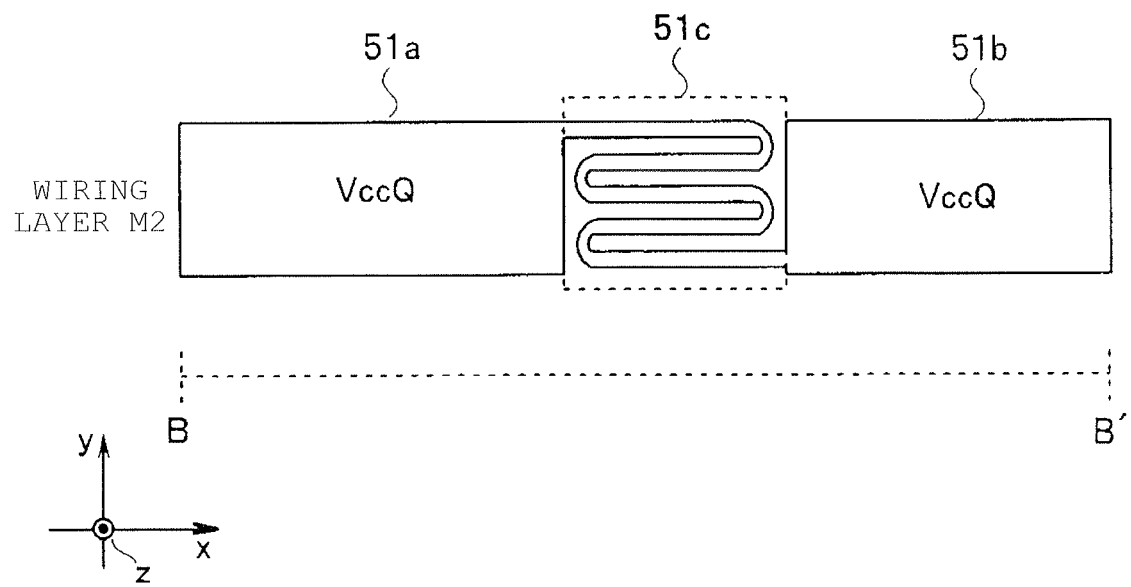
FIG. 6B is a diagram illustrating a planar structure when a high resistance portion is formed using the same wiring layer.
Figure 6C:
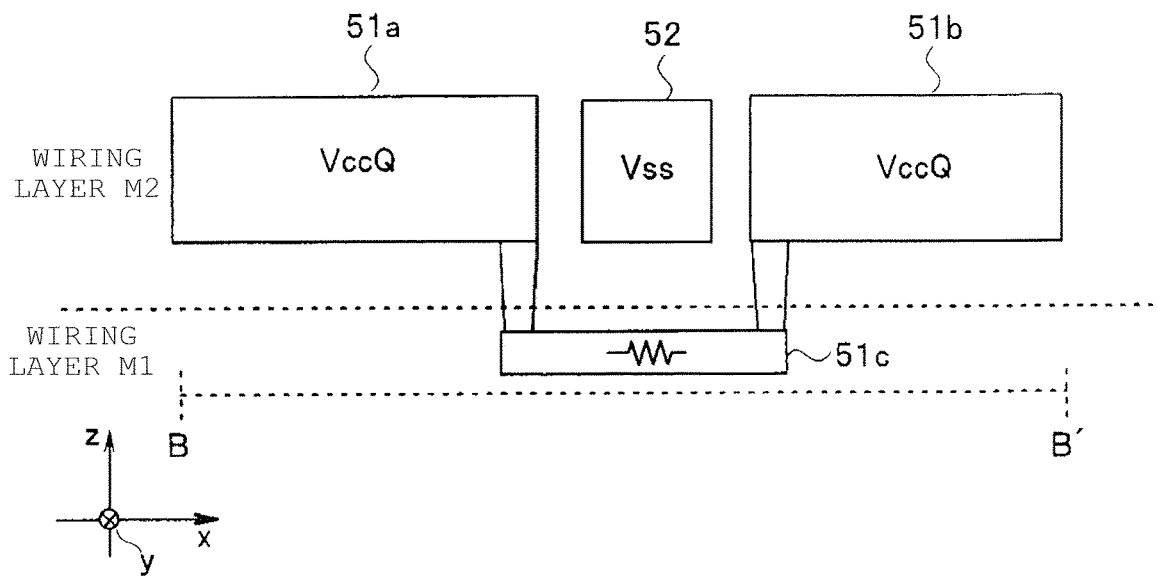
FIG. 6C is a diagram illustrating a cross-sectional structure when a high resistance portion is formed using another wiring layer.

The VccQ voltage supply line 51a and the VccQ voltage supply line 51b may be configured as wirings completely separated by a blocking region 54 as a first supply prevention unit. The blocking region 54 may be either a separation space, or a high resistance portion between the supply line 51a and the supply line 51b as a substantially disconnection state (state in which an electric current hardly flows). A method of forming a high resistance portion between the VccQ voltage supply line 51a and the VccQ voltage supply line 51b will be described with reference to FIG. 6. FIG. 6 is a diagram for illustrating the structure of the intersection of the VccQ voltage supply line and the Vss voltage supply line. FIG. 6A is a cross-sectional view taken along line A-A' of FIG. 5. FIG. 6B is a diagram showing a planar structure when a high resistance portion is formed using the same wiring layer, and is an enlarged plan view in the vicinity of the line B-B' of FIG. 5. FIG. 6C is a diagram showing a cross-sectional structure when a high resistance portion is formed using another wiring layer, and is a cross-sectional view taken along line B-B' of FIG. 5. The example of FIG. 6C shows a case where two wiring layers are provided.

As shown in FIG. 6A, two wiring layers are formed on a semiconductor substrate with an insulating layer interposed therebetween. The insulating layer may be formed using, for example, a silicon oxide film. In general, the lower the wiring layer is, the higher the resistance is. Therefore, signal lines necessary to transmit signals at high speed may be assigned to the upper layer.

A Vss voltage supply line 52u for transmitting the ground voltage Vss may be assigned to the lower wiring layer (wiring layer M1) of the two wiring layers. The Vss voltage supply line 52u extends in the y-direction. The VccQ voltage supply line 51 for transmitting the power supply voltage VccQ and the Vss voltage supply line 52 may be assigned to the upper wiring layer (wiring layer M2). The VccQ voltage supply line 51 extends in the x-direction, and the Vss voltage supply line 52 extends in the y-direction. The Vss voltage supply line 52 in the wiring layer M2 has a divided region formed in the middle, and the VccQ voltage supply line 51 passes through the divided portion. The Vss voltage supply line 52 is connected to the Vss voltage supply line 52u by a contact wiring in the vicinity of the divided portion.

That is, both the power supply voltage VccQ and the ground voltage Vss may be basically transmitted with low resistance by the wiring in the wiring layer M2, but at the portion where the VccQ voltage supply line 51 and the Vss voltage supply line 52 intersect, the ground voltage Vss may be transferred through the wiring (Vss voltage supply line 52u) in the wiring layer M1.

Next, a first method for forming a high resistance portion as the blocking region 54 between the VccQ voltage supply line 51a and the VccQ voltage supply line 51b will be described with reference to FIG. 6B. The first method is a method of forming a high resistance portion by using a wiring having a small cross-sectional area and a long wiring length. That is, as shown in FIG. 6B, between the VccQ voltage supply line 51a and the VccQ voltage supply line 51b, a VccQ voltage supply line 51c having a small wiring diameter may be arranged in a meander pattern, so that the connection portion between the VccQ voltage supply line 51a and the VccQ voltage supply line 51b can be made high resistance. The shape of the VccQ voltage supply line 51c is not limited to the meander pattern, and may be any shape as long as the wiring length can be increased.

Next, a second method of forming a high resistance portion between the VccQ voltage supply line 51a and the VccQ voltage supply line 51b will be described with reference to FIG. 6C. The second method is a method of using a high resistance wiring layer M1. That is, at the intersection of the VccQ voltage supply line 51 and the Vss voltage supply line 52, the Vss voltage supply line 52 extends the wiring layer M2 in the y-direction. That is, the Vss voltage supply line 52 passes through the region between the VccQ voltage supply line 51a and the VccQ voltage supply line 51c. The VccQ voltage supply line 51a is connected to the VccQ voltage supply line 51c by a contact wiring in the vicinity of the end portion on the Vss voltage supply line 52 side. The VccQ voltage supply line 51b is connected to the VccQ voltage supply line 51c by a contact wiring in the vicinity of the end portion on the Vss voltage supply line 52 side. By forming the VccQ voltage supply line 51c from, for example, polysilicon or the like, the resistance can be made higher than that of the VccQ voltage supply lines 51a and 51b made of metal. The layer for forming the VccQ voltage supply line 51c is not limited to the wiring layer M1. When there are three or more wiring layers, the layer may be formed in a lower wiring layer.

In order to improve the AC characteristics of the I/O unit 301, it is preferable not only to eliminate the disturbance received from the other circuit unit 302 and the like via the VccQ voltage supply line 51, but also to align the circuit configuration inside the I/O unit 301. In other words, the IR drop amount generated in each of the I/O units 301a to 301d, that is, the voltage drop amount variation caused by the product (IR product) of the current (I) and the wiring resistance (R) generated on the power supply wiring can be reduced, and therefore, the skew can be further reduced.

Figure 7:
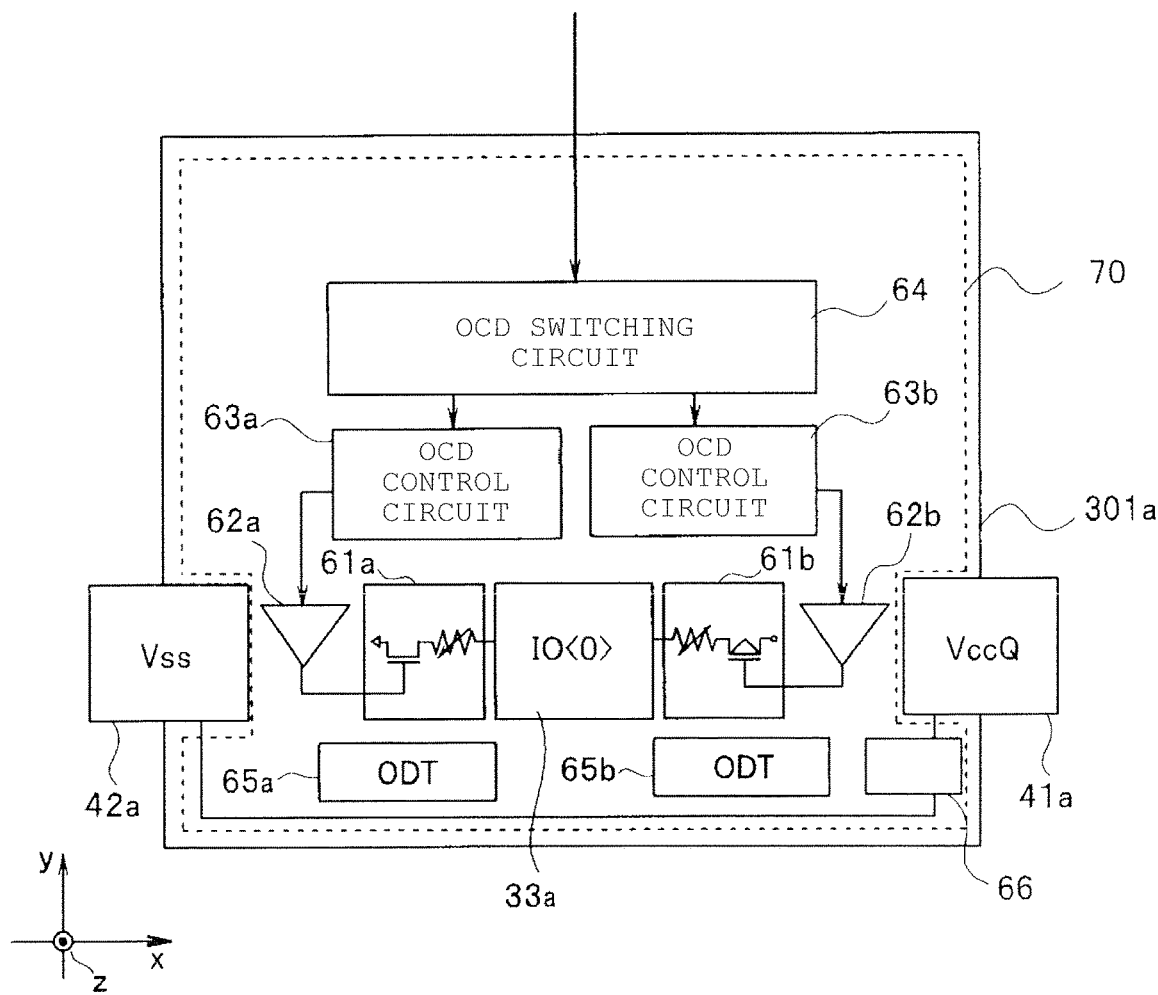
FIG. 7 is a schematic block diagram illustrating a circuit configuration of an I/O unit.

FIG. 7 is a schematic block diagram illustrating the circuit configuration of the I/O unit. Since the internal circuit configurations of the I/O units 301a to 301d are substantially the same, the following description will be made using the I/O unit 301a. The I/O unit 301a includes a pad 33a for inputting and outputting the signal DQ<0>, a pair of ODT (on die termination) circuits 65a and 65b, and a pair of OCD (off chip driver) circuits 61a and 61b. Further, the I/O unit 301a includes drivers 62a and 62b, OCD control circuits 63a and 63b, and an OCD switching circuit 64 as drive control units for driving the OCD circuits 61a and 61b. Further, the I/O unit 301a includes an ESD protection circuit 66. In addition, the I/O unit 301a may include an input receiver (not shown) or the like for converting the input signal from the memory controller 1 into an appropriate voltage level for processing in the non-volatile memory 2, for example, and transferring the converted input signal to other circuits in the nonvolatile memory 2. All the circuits configured in the I/O unit 301a are collectively referred to as an input and output circuit group 70.

The OCD circuits 61a and 61b may function as, for example, a buffer, convert a signal transferred from the memory cell array 21 to an appropriate voltage level, and output the converted signal to the memory controller 1. The OCD circuit 61a may include an n-channel MOS transistor and a variable resistance element in series between the pad 33a for inputting and outputting signals and the Vss power supply pad 42a. Further, the OCD circuit 61b may include a p-channel MOS transistor and a variable resistance element in series between the VccQ power supply pad 41a and the pad 33a for inputting and outputting signals.

The OCD control circuits 63a and 63b may input control signals for instructing the turning-on or off of the OCD circuits 61a and 61b and output resistance values to the OCD circuits 61a and 61b via the drivers 62a and 62b. The OCD switching circuit 64 may determine which one of the OCD circuits 61a and 61b is used to output data according to 0/1 of the inputted output data signal, and instruct the OCD control circuits 63a and 63b to switch the operation.

The ODT circuits 65a and 65b are provided between the pad 33a and the input receiver and function as a termination resistor circuit. One of the ODT circuits 65a and 65b may be a p-side ODT circuit including the p-channel MOS transistor and the variable resistance element, and the other of the ODT circuits 65a and 65b may be an n-side ODT circuit including the n-channel MOS transistor and the variable resistance element.

Between the VccQ power supply pad 41a and the Vss power supply pad 42a, for example, an RCTMOS (RC trigger MOS) 66 may be provided as a protection circuit against ESD (Electro Static Discharge). In addition, a plurality of power stabilization capacitors (bypass capacitors, not shown) may be connected between the Vss voltage supply line 52 and the VccQ voltage supply line 51.

By unifying all the I/O units 301 with, for example, the configuration shown in FIG. 7, the variation in the IR drop amount can be reduced. Not only the individual components shown in FIG. 7, but also components not shown, such as the number and capacitances of bypass capacitors, may be preferably unified in all I/O units 301 as much as possible.

As described above, in this embodiment, the VccQ voltage supply line 51 that supplies the power supply voltage VccQ to the I/O unit 301 is divided and formed into the VccQ voltage supply line 51a laid inside the I/O units 301a to 301d, and the VccQ voltage supply line 51b laid outside the I/O units 301a to 301d. Accordingly, it is possible to prevent current from flowing into and out of the adjacent other circuit unit 302 and the like via the VccQ voltage supply line 51. That is, since the disturbance factor of the power supply voltage of the I/O units 301a to 301d can be eliminated, the skew between the I/O units 301a to 301d can be reduced. Accordingly, the AC characteristics of the I/O unit 301 can be improved.

Next, a modification of the first embodiment will be described with reference to FIG. 8. FIG. 8 is a schematic layout diagram of power supply pads and power supply wirings of a pad unit according to the modification of the first embodiment. The present modification differs from the first embodiment described with reference to FIG. 5 in that the VccQ voltage supply line 51 is further divided and formed. That is, the VccQ voltage supply line 51a laid inside the I/O units 301a to 301d is divided into a VccQ voltage supply line 51a1 and a VccQ voltage supply line 51a2. Specifically, the VccQ voltage supply line 51a is divided between the I/O unit 301b and the I/O unit 301c.

By dividing the VccQ voltage supply line 51a in this way, the power supply voltage VccQ supplied from the VccQ power supply pad 41a can be supplied to the I/O units 301a and 301b by the VccQ voltage supply line 51a1, and the power supply voltage VccQ supplied from the VccQ power supply pad 41b can be supplied to the I/O units 301c and 301d by the VccQ voltage supply line 51a2.

Therefore, the I/O units 301a and 301b may have no current flowing into and out due to the power supply voltage VccQ supplied from the VccQ power supply pad 41b, and the I/O units 301c and 301d may have no current flowing into and out due to the power supply voltage VccQ supplied from the VccQ power supply pad 41a. Therefore, it is possible to eliminate disturbance factors not only from the adjacent other circuit unit 302 but also from other I/O units 301 that do not share the VccQ power supply pad, and the skew between the I/O units 301a to 301d can be further reduced. Therefore, the AC characteristics of the I/O unit 301 can be further improved.

In the above description, an example in which two VccQ power supply pads 41a and 41b and three Vss power supply pads 42a to 42c are provided in the four I/O units 301a to 301d has been described. As shown in FIG. 9, the arrangement of the VccQ power supply pad 41 and the Vss power supply pad 42 may be reversed. FIG. 9 is another schematic layout diagram of power supply pads and power supply wirings of a pad unit according to the modification of the first embodiment. That is, three VccQ power supply pads 41a to 41c and two Vss power supply pads 42a and 42b may be provided in the four I/O units 301a to 301d. In this case, the divided positions of the VccQ voltage supply line 51a laid inside the I/O units 301a to 301d are two locations in total, between the I/O unit 301a and the I/O unit 301b, and between the I/O unit 301c and I/O unit 301d. In other words, the VccQ voltage supply line 51a laid inside the I/O units 301a to 301d is divided into a VccQ voltage supply line 51a1, a VccQ voltage supply line 51a2, and a VccQ voltage supply line 51a3.

(Second Embodiment)

Next, a semiconductor memory device according to a second embodiment of the present disclosure will be described. The semiconductor memory device of this embodiment differs from the semiconductor memory device of the first embodiment described above in the layout of the VccQ voltage supply line 51 and the Vss voltage supply line 52. The configuration of the semiconductor memory device of this embodiment and the layout of the I/O unit 301 excluding the VccQ voltage supply line 51 and the Vss voltage supply line 52 are the same as those of the semiconductor memory device of the first embodiment described above. Therefore, the descriptions thereof are omitted, and only differences from, the first embodiment will be described below.

FIG. 10 is a schematic layout diagram of power supply pads and power supply wirings of a pad unit according to the second embodiment. As in the comparative example, the VccQ voltage supply line 51 is a common wiring from the I/O units 301a to 301d to the other circuit unit 302. On the other hand, the Vss voltage supply line 52 is divided into a Vss voltage supply line 52a laid inside the I/O units 301a to 301d as the input second electric potential supply line, and a Vss voltage supply line 52b laid outside the I/O units 301a to 301d.

As described above, according to the present embodiment, by dividing and forming the Vss voltage supply line 52, it is possible to prevent current from flowing into and out of the adjacent other circuit unit 302 and the like via the Vss voltage supply line 52. That is, since the disturbance factor of the power supply voltage of the I/O units 301a and 301d can be eliminated, the skew between the I/O units 301a to 301d can be reduced. Accordingly, the AC characteristics of the I/O unit 301 can be improved.

The divided portion of the Vss voltage supply line 52 may be formed by routing a high-resistance wire having a small wiring diameter and a long length, as in the method of forming the divided portion of the VccQ voltage supply line 51 in the first embodiment, and may be formed using a high resistance wiring portion such as the wiring layer M1.

Further, in order to further ensure the separation of the ground voltage Vss in the I/O unit 301 and the other circuit unit 302, the substrate may have a triple well structure. FIG. 11 is a cross-sectional view schematically showing the substrate structure in the formation regions of the I/O unit and the other circuit unit. For example, when an n-channel transistor is formed in each portion using a p-type semiconductor substrate, the I/O unit 301 may directly form the transistor on the substrate (p-sub). On the other hand, a deep n-well may be formed in the substrate, further a shallow p-well may be formed therein, and the other circuit unit 302 may be formed in the region where the p-well is formed.

By using such a triple well structure, the p-sub in which the I/O unit 301 is formed and the p-well in which the other circuit unit 302 is formed may be electrically separated by the n-well. Therefore, since the interference of the ground voltage Vss through the substrate can be prevented, the skew between the I/O units 301a to 301d can be reduced more reliably. Accordingly, the AC characteristics of the I/O unit 301 can be improved.

Next, a modification of the second embodiment will be described with reference to FIG. 12. FIG. 12 is a schematic layout diagram of power supply pads and power supply wirings of a pad unit according to the modification of the second embodiment. This modification differs from the second embodiment described with reference to FIG. 10 in that a parasitic resistance 53 is added to the connection portion between the Vss voltage supply line 52a and the Vss power supply pads 42a and 42c.

The Vss power supply pad 42a may supply the ground power supply Vss to one I/O unit 301a. Similarly, the Vss power supply pad 42c may supply the ground power supply Vss to one I/O unit 301d. On the other hand, the Vss power supply pad 42b may supply the ground power supply Vss to the two I/O units 301b and 301c. That is, the current that flows from the circuit of the two I/O units 301b and 301c into the Vss power supply pad 42b may be about twice the current that flows from the circuit of the I/O unit 301a into the Vss power supply pad 42a. Similarly, the current that flows from the circuit of the two I/O units 301b and 301c into the Vss power supply pad 42b may be about twice the current that flows from the circuit of the I/O unit 301d into the Vss power supply pad 42c.

By adding the parasitic resistance 53 to the connection portion between the Vss voltage supply line 52a and the Vss power supply pads 42a and 42c, the current supply amounts of the Vss power supply pads 42a to 42c can be adjusted to be uniform. By adjusting the current supply amount to reduce the difference between the I/O units 301, the skew between the I/O units 301a to 301d can be further reduced. The current supply amount may be adjusted not only by adding the parasitic resistance 53 to the connection portion between the Vss voltage supply line 52a and the Vss power supply pads 42a and 42c, but also by lowering the resistance by forming the connection portion between the Vss voltage supply line 52a and the Vss power supply pad 42b in the wiring layer M2.

(Third Embodiment)

Next, a semiconductor memory device according to a third embodiment of the present disclosure will be described. The semiconductor memory device of this embodiment differs from the semiconductor memory device of the first embodiment described above in the layout of the Vss voltage supply line 52. The configuration of the semiconductor memory device according to the present embodiment and the layout of the I/O unit 301 excluding the Vss voltage supply line 52 are the same as those of the semiconductor memory device according to the first embodiment described above. Therefore, the descriptions thereof are omitted and only differences from the first embodiment will be described.

FIG. 13 is a schematic layout diagram of power supply pads and power supply wirings of a pad unit according to the third embodiment. The VccQ voltage supply line 51 is divided into the VccQ voltage supply line 51a laid inside the I/O units 301a to 301d and the VccQ voltage supply line 51b laid outside the I/O units 301a to 301d. Also, the Vss voltage supply line 52 is divided into the Vss voltage supply line 52a laid inside the I/O units 301a to 301d and the Vss voltage supply line 52b laid outside the I/O units 301a to 301d.

As described above, according to the present embodiment, by dividing and forming the VccQ voltage supply line 51 and the Vss voltage supply line 52, it is possible to prevent current from flowing into and out of the adjacent other circuit 302 and the like via the VccQ voltage supply line 51 and the Vss voltage supply line 52. That is, in the I/O units 301a and 301d, disturbance factors can be eliminated for both the power supply voltage VccQ and the ground voltage Vss, and thus, the skew between the I/O units 301a to 301d can be further reduced. Accordingly, the AC characteristics of the I/O unit 301 can be improved.

Figure 14:
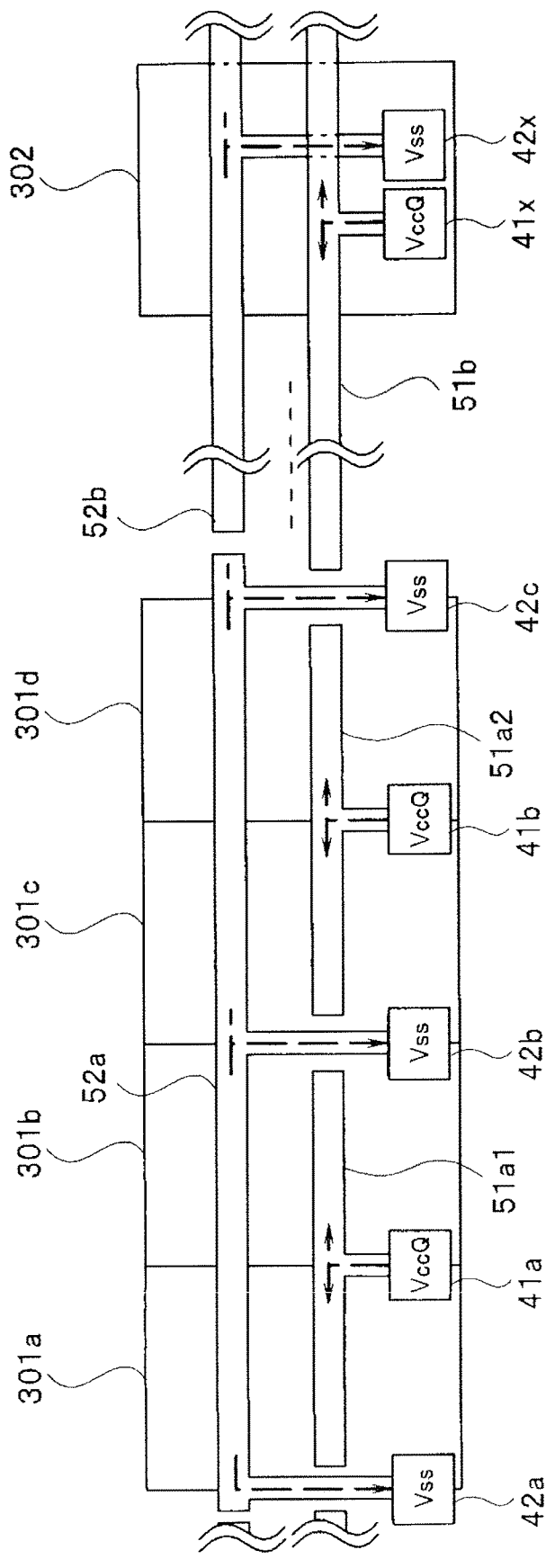
FIG. 14 is a schematic layout diagram of power supply pads and power supply wirings in a pad unit according to a modification of the third embodiment.

FIG. 14 is a schematic layout diagram of power supply pads and power supply wirings of a pad unit according to a modification of the third embodiment. As shown in FIG. 14, the VccQ voltage supply line 51a is divided into the VccQ voltage supply line 51a1 and the VccQ voltage supply line 51a2. Specifically, the VccQ voltage supply line 51a is divided between the I/O unit 301b and the I/O unit 301c.

With such a configuration, it is possible to eliminate disturbance factors from not only the adjacent other circuit unit 302 but also other I/O units 301 that do not share the VccQ power supply pad, and therefore, the skew between the I/O units 301a to 301d can be further reduced. Accordingly, the AC characteristics of the I/O unit 301 can be further improved.

(Fourth Embodiment)

Figure 15:
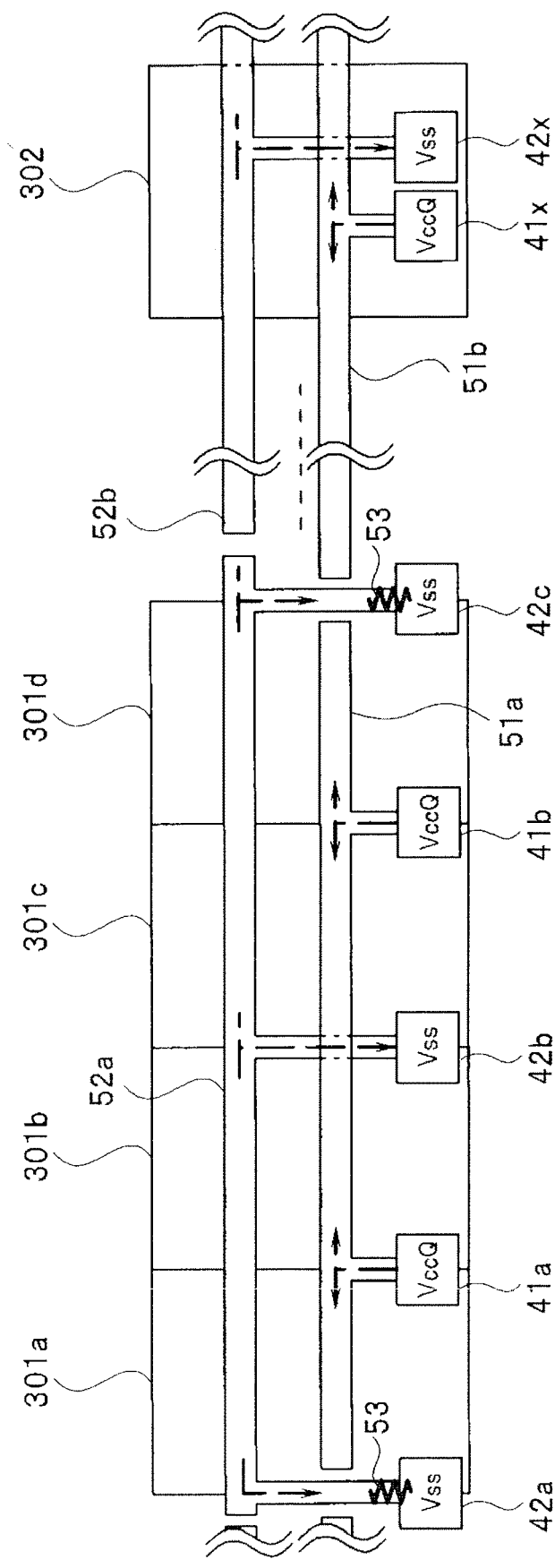
FIG. 15 is a schematic layout diagram of power supply pads and power supply wirings of a pad unit according to a fourth embodiment.
Figure 16:
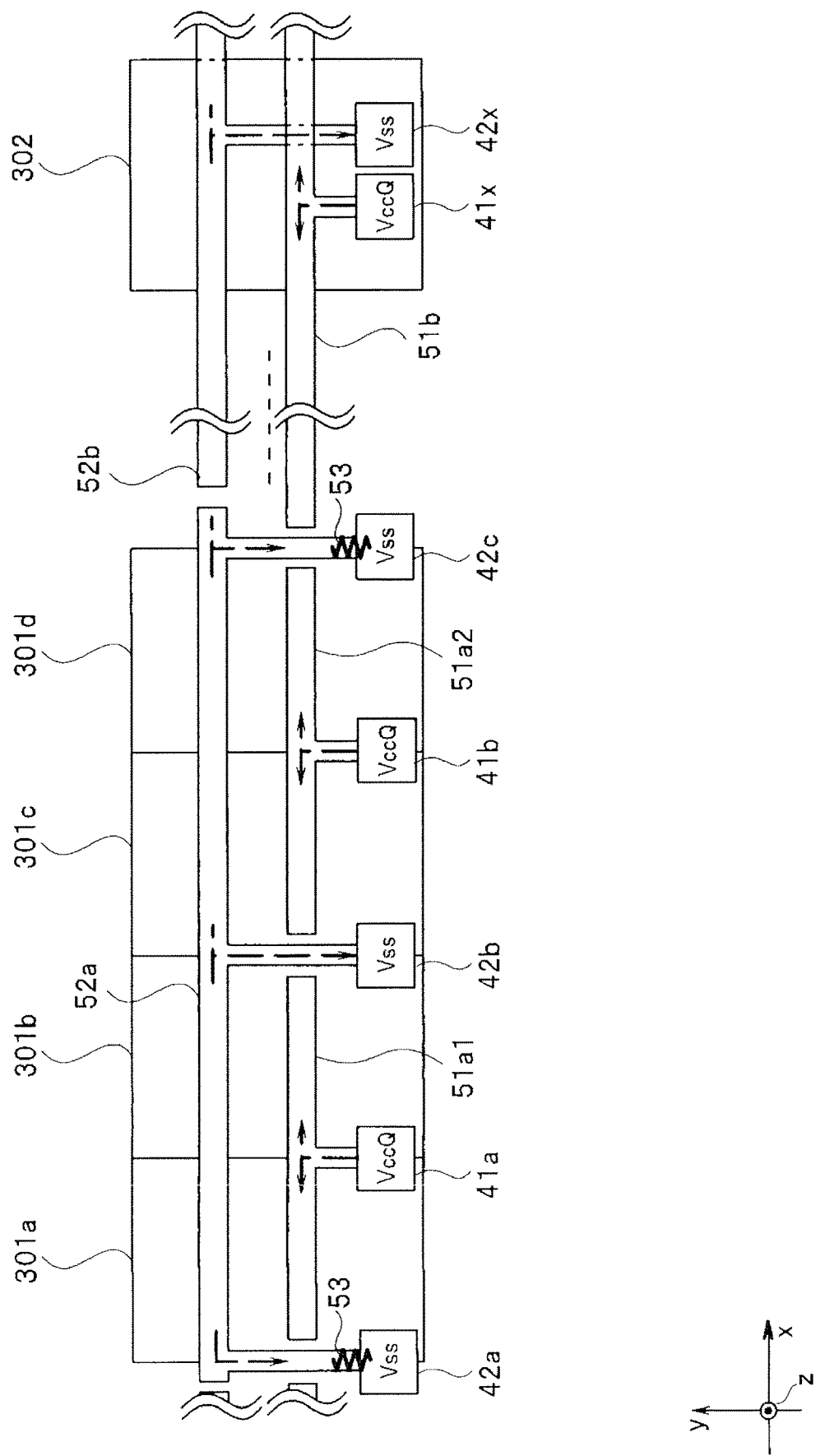
FIG. 16 is a schematic layout diagram of power supply pads and power supply wirings in a pad unit according to a modification of the fourth embodiment.

Next, a semiconductor memory device according to a fourth embodiment of the present disclosure will be described. The semiconductor memory device of this embodiment differs from the semiconductor memory device of the third embodiment described above in that the parasitic resistance 53 is provided in the Vss voltage supply line 52a. FIG. 15 is a schematic layout diagram of power supply pads and power supply wirings of a pad unit according to the fourth embodiment.

The VccQ voltage supply line 51 is divided into the VccQ voltage supply line 51a laid inside the I/O units 301a to 301d and the VccQ voltage supply line 51b laid outside the I/O units 301a to 301d. Also, the Vss voltage supply line 52 is divided into the Vss voltage supply line 52a laid inside the I/O units 301a to 301d and the Vss voltage supply line 52b laid outside the I/O units 301a to 301d. Further, the parasitic resistor 53 is provided in the connection portion between the Vss voltage supply line 52a and the Vss power supply pads 42a and 42c. With such a configuration, it is possible to eliminate disturbance factors from the adjacent other circuit unit 302 and other I/O units 301 that do not share the VccQ power supply pad, and the current supply amount of the Vss power supply pads 42a to 42c can be adjusted to be uniform. Therefore, the skew between the I/O units 301a to 301d can be further reduced, and the AC characteristics of the I/O unit 301 can be further improved.

The above-described embodiments have described a case where the power supply wiring (the VccQ voltage supply line 51 and/or the Vss voltage supply line 52) shared between the I/O unit 301 and the other circuit 302 are separated and formed in order to eliminate the disturbance factors that the I/O unit 301 receives from the other circuit 302. Also in the I/O unit 301, for example, the signal input and output behavior in the I/O units 301a to 301d, and 301g to 301j that transmit and receive the signal DQ<7:0> may be different from the behavior in the I/O units 301e and 301f that transmit and receive the data strobe signals DQS and/DQS. Therefore, in order that the two I/O units 301d and 301e that are provided adjacently and have different signal input and output behaviors do not interfere with each other, the shared power supply wiring (the VccQ voltage supply line 51 and/or the Vss voltage supply line 52) may be formed separately between the I/O unit 301d and the I/O unit 301e. The same applies to the I/O unit 301f and the I/O unit 301g.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device comprising:
   a plurality of pads configured to input and output data;
   a plurality of input and output control circuit groups connected to the pads;
   a first electric potential supply line for supplying a first electric potential to the input and output control circuit groups;
   a second electric potential supply line for supplying a second electric potential lower than the first electric potential to the input and output control circuit groups;
   a plurality of first power supply pads for supplying the first electric potential to the first electric potential supply line; and
   a plurality of second power supply pads for supplying the second electric potential to the second electric potential supply line, wherein
   at least one of the first electric potential supply line or the second electric potential supply line is provided with a blocking region such that
   (1) the blocking region for the first electric potential supply prevents supply of the first electric potential, and the first electric potential is supplied to the plurality of input and output control circuit groups from the first electric potential supply line divided by the blocking region, or
   (2) the blocking region for the second electric potential supply prevents supply of the second electric potential, and the second electric potential is supplied to the plurality of input and output control circuit groups from the second electric potential supply line divided by the blocking region.

2. The semiconductor device according to claim 1, wherein the plurality of input and output control circuit groups are connected to each of the pads.

3. The semiconductor device according to claim 1, wherein the first electric potential supply line is configured to supply the first electric potential to each of the input and output control circuit groups.

4. The semiconductor device according to claim 1, wherein the second electric potential supply line is configured to supply the second electric potential to each of the input and output control circuit groups.

5. The semiconductor device according to claim 1, wherein
   the blocking region includes a first blocking region provided in the first electric potential supply line, and
   the first electric potential is supplied to the plurality of input and output control circuit groups from one of first electric potential supply lines divided by the first blocking region.

6. The semiconductor device according to claim 5, wherein
   the first electric potential supply line is provided with one or more second blocking regions for preventing the supply of the first electric potential, and
   the first electric potential is supplied to each of the first electric potential supply lines divided by (1) the first blocking region and one second blocking region or (2) two second supply prevention units, from a different first power supply pad.

7. The semiconductor device according to claim 5, wherein
   the second electric potential is supplied to the plurality of input and output control circuit groups from an input electric potential supply line that is one of second electric potential supply lines divided by the first blocking region provided in the second electric potential supply line.

8. The semiconductor memory device according to claim 7, wherein
   a resistance circuit is provided at a connection portion between a second power supply pad connected to the input electric potential supply line closest to the first blocking region, and the input electric potential supply line.

9. A semiconductor memory device comprising:

a memory cell array including a plurality of memory cells;

a plurality of pads configured to input and output data to be written to the memory cell array;

a plurality of input and output control circuit groups connected to the pads;

an electric potential supply line for supplying a predetermined electric potential to the input and output control circuit groups; and a plurality of power supply pads for supplying the predetermined electric potential to the electric potential supply line, wherein the electric potential supply line is provided with a first blocking region that blocks the supply of the predetermined electric potential, and the predetermined electric potential is supplied to the plurality of input and output control circuit groups from one of electric potential supply lines divided by the first blocking region.

10. The semiconductor memory device according to claim 9, wherein the plurality of input and output control circuit groups are connected to each of the pads.

11. The semiconductor memory device according to claim 9, wherein the electric potential supply line is configured to supply the predetermined electric potential to each of the input and output control circuit groups.

12. The semiconductor memory device according to claim 9, wherein the electric potential supply line includes a first electric potential supply line for supplying a first electric potential to each of the input and output control circuit groups, and a second electric potential supply line for supplying a second electric potential lower than the first electric potential for each of the input and output control circuit groups, and the power supply pad includes a plurality of first power supply pads for supplying the first electric potential to the first electric potential supply line, and a plurality of second power supply pads for supplying the second electric potential to the second electric potential supply line.

13. The semiconductor memory device according to claim 12, wherein the first electric potential is supplied to the plurality of input and output control circuit groups from one of first electric potential supply lines divided by the first blocking region provided in the first electric potential supply line.

14. The semiconductor memory device according to claim 13, wherein the first electric potential supply line is provided with one or more second blocking regions for preventing the supply of the first electric potential, and the first electric potential is supplied to each of the first electric potential supply lines divided by (1) the first blocking region and one second blocking region or (2) two second supply prevention units, from a different first power supply pad.

15. The semiconductor memory device according to claim 12, wherein the second electric potential is supplied to the plurality of input and output control circuit groups from an input electric potential supply line that is one of second electric potential supply lines divided by the first blocking region provided in the second electric potential supply line.

16. The semiconductor memory device according to claim 15, wherein a resistance circuit is provided at a connection portion between the second power supply pad connected to the input electric potential supply line closest to the first blocking region, and the input electric potential supply line.

* * * * *